United States Patent [19]

Palkovich et al.

[11] Patent Number: 5,614,880
[45] Date of Patent: Mar. 25, 1997

[54] SUPERCONDUCTING MAGNET WITH SYMMETRICAL PLURAL AIR GAPS

[75] Inventors: Alex Palkovich, Oxford; John M. Bird, Charlbury; Tomas Duby, Kidlington, all of England

[73] Assignee: Elscint Ltd., Haifa, Israel

[21] Appl. No.: 358,975

[22] Filed: Dec. 19, 1994

Related U.S. Application Data

[63] Continuation of Ser. No. 152,098, Nov. 15, 1993, abandoned, which is a continuation of Ser. No. 911,353, Jul. 9, 1992, abandoned, which is a continuation of Ser. No. 818,423, Dec. 26, 1991, abandoned, which is a continuation of Ser. No. 676,421, Mar. 28, 1991, abandoned.

[30] Foreign Application Priority Data

Apr. 2, 1990 [GB] United Kingdom ............... 9007980

[51] Int. Cl.⁶ .................................................. H01F 5/00
[52] U.S. Cl. ........................... 335/299; 324/318; 335/216
[58] Field of Search .................................. 335/216, 296, 335/299, 301; 324/318, 319, 320

[56] References Cited

U.S. PATENT DOCUMENTS

| | | | |
|---|---|---|---|
| 4,564,812 | 1/1986 | Van Dijk | 324/309 |
| 4,668,915 | 5/1987 | Daubin et al. | 324/309 |
| 4,864,240 | 9/1989 | Young | 324/318 |
| 4,870,380 | 9/1989 | McGinley | 335/296 |
| 4,968,937 | 11/1990 | Akgun | 324/318 |
| 5,061,897 | 10/1991 | Danby et al. | 324/318 |

FOREIGN PATENT DOCUMENTS 0325313  7/1989  European Pat. Off. ............ 335/216

Primary Examiner—Lincoln Donovan
Attorney, Agent, or Firm—Greenblum & Bernstein P.L.C.

[57] ABSTRACT

A super-conducting magnet for magnetic resonance imaging systems comprising symmetrically located back-to-back C-frame magnets.

4 Claims, 3 Drawing Sheets

SUPERCONDUCTING MAGNET WITH SYMMETRICAL PLURAL AIR GAPS

This application is a continuation of application Ser. No. 08/152,098, filed 15 Nov. 1993, now abandoned, which is a continuation of Ser. No. 07/911,353, filed Jul. 9, 1992, now abandoned, which is a continuation of Ser. No. 07/818,423, filed Dec. 26, 1991, now abandoned, which is a continuation of Ser. No. 07/676,421, filed Mar. 28, 1991, now abandoned.

FIELD OF THE INVENTION

This invention is concerned with superconducting magnets for use in magnetic resonance imaging (MRI) systems, and more particularly with magnets of the type commonly referred to as C-shaped magnets.

BACKGROUND OF THE INVENTION

Superconducting magnets presently in use in MRI systems are basically cylindrical with the magnet in the cryostat and having a bore tube external to the cryostat through which the generated magnetic flux runs. The patient is placed in a prone position in the bore tube virtually coaxially with the longitudinal axis of the cylindrical magnet. Thus, the magnetic lines of force run parallel to the longitudinal axis of the patient.

Among the drawbacks of the present cylindrical magnets is that the patient is wholly within the cylinder; i.e., from the time the patient is inserted into the bore tube, the doctor does not have ready access to the patient. The lack of access is a problem where the patient is in critical condition and needs continual or emergency aid from the doctor. The present systems require the patient to be removed from the bore tube of the magnet to enable access by the doctor. The time taken to remove the patient from the bore tube could be critical.

The cylindrical type magnets have an additional shortcoming. The magnetic lines of flux travel largely through air which offers a much higher reluctance than does a magnetizable material such as iron or steel. Consequently, the magnetic field is inherently weakened by the large proportion of the travel of the flux that is through air.

In the past, attempts have been made to provide more iron in the path of the magnetic flux. This has been attempted by utilizing C-frame magnet sections and/or what are known as "H-frame" magnet sections. In the C-frame construction, an iron or steel yoke passing through an electro-magnet carries magnetic flux to two oppositely disposed pole pieces. Flux crossing the air gap between these pole pieces is guided by pole shaping sections or electrical coils to form homogeneous zones suitable for MRI studies.

In the past, C-frame type magnets have had at least two fundamental problems which have inhibited their use in MRI studies.

The problems are:

1) the C-frame magnet is mechanically unbalanced by the magnetic forces applied between the poles. With the high powered magnets used, there is actually some small, but non-negligible movement when the superconducting coil of the magnet is conducting. The magnetic attraction upsets the homogeneity of the flux between the pole pieces; and 2) the stray field performance in the C-type magnets is much worse than the stray field performance using state of the art devices presently available for controlling the stray fields generated by cylindrical high-field magnets.

Another magnet shape design that has been attempted to improve the presently available magnetic resonance systems has been the H-frame magnets. Such magnets provide a double path of magnetic material for the magnetic lines of force. The H-frame magnet has a number of serious problems when used in high field superconducting devices. With the H-frame, the magnet system has to be enlarged to accommodate a complete cryostat. In addition, there is still no access for the doctor. Thus, as far as patient accessibility the H-frame magnets are similar to the cylindrical magnets presently in use. In addition, the H-frame magnet is unbalanced magnetically and thus, there is great difficulty in obtaining homogeneous fields with the H-frame magnet. There have been suggestions by designers who propose to balance the design with a second cryostat and superconducting coils. However, such designs are inherently even larger and more expensive than the regular H-frame magnets.

Accordingly, those skilled in the art are still searching for new and improved magnets for use in MRI systems.

BRIEF DESCRIPTION OF THE INVENTION

In accordance with a preferred aspect of the present invention, a superconducting magnet for magnetic resonance imaging (MRI) systems is provided, said magnet, comprising:

a double C-frame magnet.

More particularly, the double C-frame magnet comprises:

a cryostat containing a superconducting coil for generating lines of force.

a central core of magnetizable material surrounded by said crystat.

a pair of beams extending symmetrically from said central core.

a plurality of oppositely disposed pairs of pole pieces connected to said pair of beams, said pairs of pole pieces each being spaced apart from the superconducting coil.

each of said pair of pole pieces defining a gap penetrated by lines of force generated by the magnet.

said gaps each being dimensioned for receiving a patient therein, and said lines of force being perpendicular to the longitudinal axis of said patient.

The centrally located superconducting coil is wound around the core in the cryostat. A pair of oppositely disposed beams of magnetizable material are mounted juxtaposed to the core, and are also exterior to the cryostat. Pole pieces are mounted at the opposite ends of the beams oppositely disposed and spaced apart from each other to form a pair of air gaps. The magnetic flux lines transverse the two sets of magnetic pole pieces and cross the gap between both sets of pole pieces when the superconducting coil is energized. The symmetrical arrangement of the double C-shaped magnet overcomes the problem faced by prior C-shaped magnets due to unbalanced magnetic forces.

The double C-shaped superconducting magnet provides two separate homogeneous zone of magnetic flux so that two MRI scans can be performed simultaneously, if desired with one cryostat. It should be understood that the number of pairs of pole pieces could be extended to provide more than two pole pieces thereby creating a plurality of zones of magnetic flux sufficiently homogeneous to enable MR imaging. Only one cyrostat superconducting coil is recruited for the plurality of magnetically homogeneous zones.

It should be noted that the accuracy of winding of the super-conducting coil need not be of an exceptionally high order since the superconducting coil itself does not generate a homogeneous zone: rather it is the arrangement of the shaped pole pieces or field shaping coils that assure homogeneity of the lines of flux. The relatively small air gap through which the lines of flux travel dramatically reduces the stray magnetic field.

Also, since the cryostats used in the double C-frame magnet arrangement are relatively small helium boil-off is minimized.

The double C-frame superconducting magnet assures continual and ready access to the patient throughout the study.

BRIEF DESCRIPTION OF THE DRAWINGS

The above described and other objects and features of the present invention will be best understood when considered in the light of the following description made in conjunction with the accompanying drawings; wherein.

GENERAL DESCRIPTION

Figure 1:
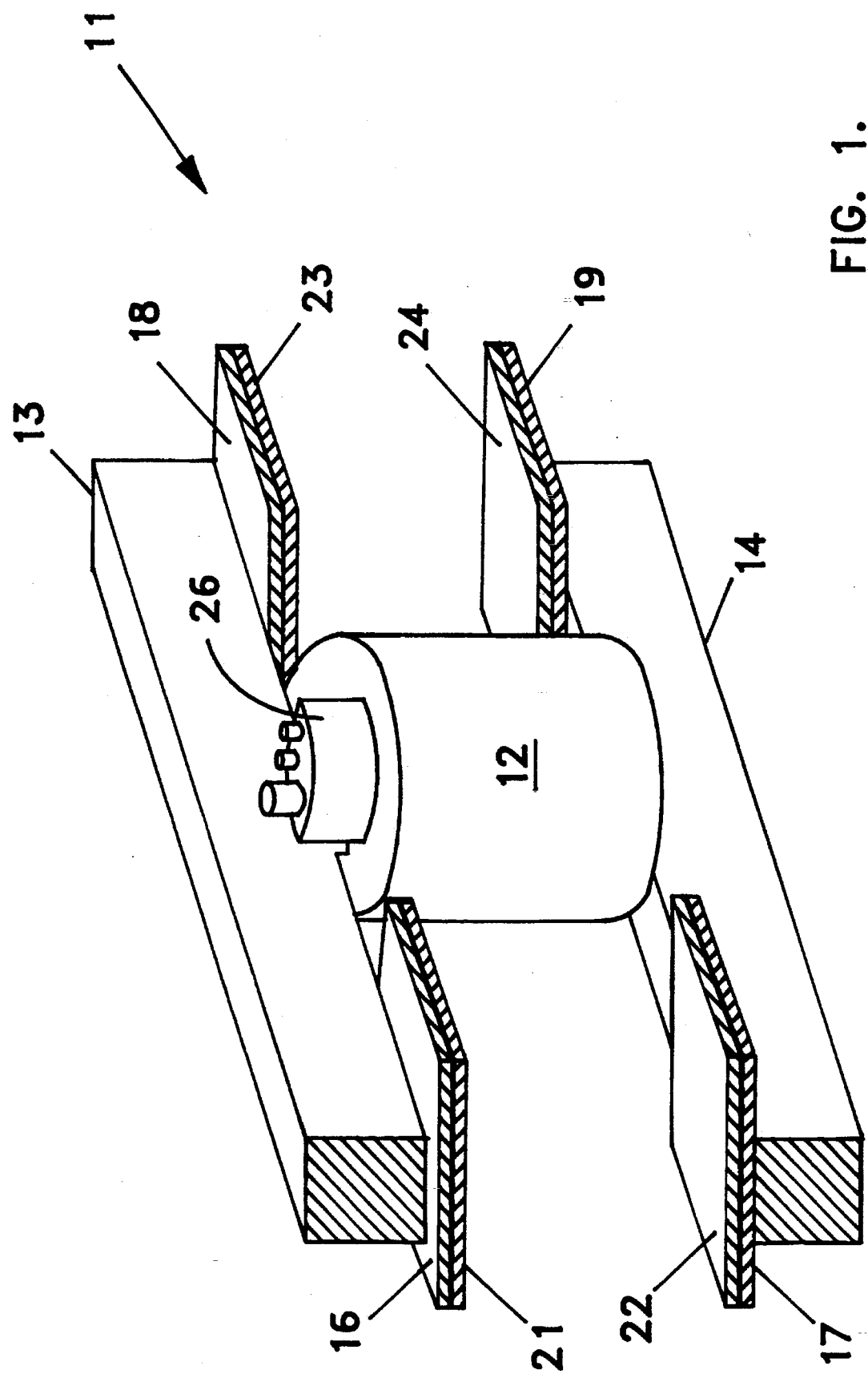
FIG. 1 is a pictorial view of a double C-frame magnet used in magnetic resonance imaging systems.

FIG. 1 at 11 shows a double C-frame superconducting magnet system for magnetic resonance imaging studies. The magnet system comprises a cryostat 12 in which a coil is arranged surrounding a vertical magnetic core. The core in a preferred embodiment is external to the cryostat. The core is juxtaposed to a pair of magnetic beams 13 and 14 at its top and bottom, respectively. The beams, which are parallel and oppositely disposed to each other each extend symmetrically in two opposite directions from the core. At both ends of both beams are magnetic pole pieces shown as pole pieces 16 and 17 on the left hand side of the cryostat, and pole pieces 18 and 19 on the right hand side of the cryostat.

Shimming means are attached to both pairs of pole pieces. For example, a shimming plate 21 is attached to pole piece 16, shimming plate 22 is attached to pole piece 17, shimming plate 23 is attached to pole piece 18 and shimming plate 24 is attached to pole piece 19. It should be understood that while shimming plates are shown, shimming coils could be used for shimming in place of the magnetic plates. The shimming, of course, is to assure homogeneity of the field between the pole pieces. A service turret 26 is shown mounted at the top of cryostat 12.

Figure 2:
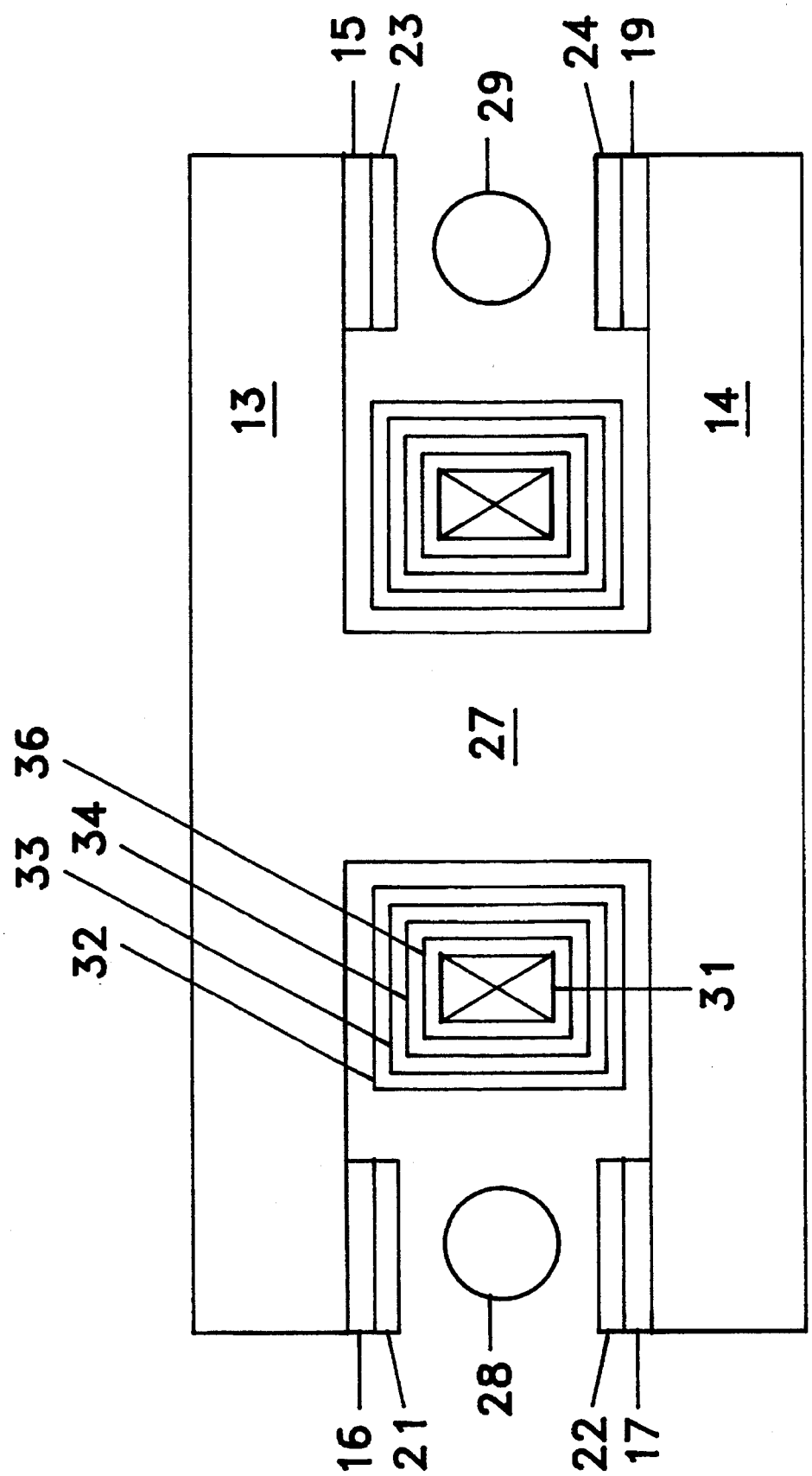
FIG. 2 is a sectional view of the double C-frame magnet of FIG. 1 showing more details thereof.

In FIG. 2 a cross sectional view of the double C-frame superconducting magnet system is shown. Core 27 is seen connecting the ferro-magnetic beams 13 and 14. FIG. 2 also shows that the magnetic poles 16, 17, 18 and 19 are topped with shimming plates 21, 22, 23 and 24 respectively.

The magnet provides two homogeneous zones. Homogeneous zone 28 is shown on the left hand side of core 27 between pole pieces 16 and 17. Homogeneous zone 29 is shown on the right hand side of magnetic core 27 between pole pieces 18 and 19. Because the flux path is largely through a ferro-magnetic material, a much greater density of flux lines per coil current is provided in the double C-frame magnet as compared to the cylindrical magnet of the prior art. The homogeneity is due primarily to the inherent characteristic of the double C-frame. The shimming enables perfecting the homogeneity of the imaging zones 28 and 29.

A single cryostat serves the dual magnetic resonance imaging system. In effect the cryostat is shown as including superconducting coils such as superconducting coil 31 which is surrounded by an outer vacuum jacket 32. The outer vacuum is defined by the thermal shielded walls 32 and 33. The thermal walls 33 and 34 define the nitrogen container which surrounds a helium container. The wall 36 defines the helium container in which the superconducting coil 31 is located.

The body and gradient coils are not shown, but preferably are positioned around the core and/or the pole pieces, for example.

In operation the superconducting coil generates the magnetic lines flux which flow through core 27 each of the pairs of pole pieces and through the homogeneous zones.

Two patients can be serviced simultaneously using the same cryostat and superconducting magnet. Thus, the described magnetic system provides the option of simultaneously serving two patients using the single cryostat. The magnetic arrangement provides greater flux field density using the same power. The problem of the unbalanced magnetic forces is overcome by the double C arrangement. The homogeneity of the field is improved by the much shorter path through air of the flux field and in addition stray magnetic lines are drastically reduced.

Figure 3:
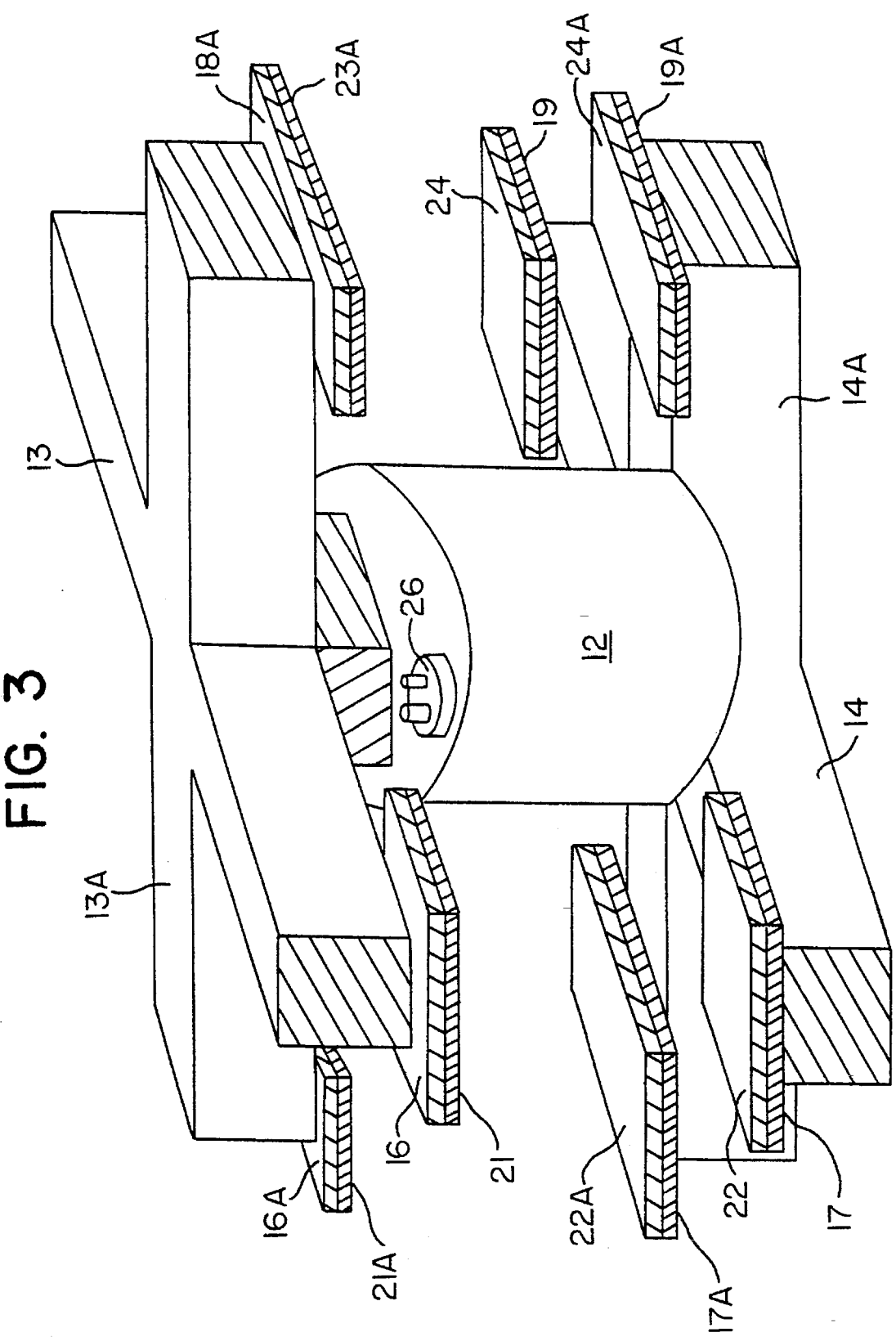
FIG. 3 is another embodiment of the double C-frame magnet.

FIG. 3 demonstrates yet another embodiment, which provides more than two pole pieces thereby creating a plurality of homogeneous zones of magnetic flux. The magnet system comprises a cryostat 12. The cope is juxtaposed to two pairs of magnetic beams 13, 14, 13a, 14a at it's top and bottom, respectively. The beams are vertically spaced apart, each of said beams being 90 degrees removed from the closest magnetic beam, thereby forming plurality of back to back C-shaped mashers symmetrically spaced apart, to form a symmetric system.

While the invention has been described with reference to a preferred embodiment, it should be understood that this embodiment is exemplary only and is not meant to act as a limitation on the scope of the invention.

What is claimed is:

1. A super conducting magnet for magnetic resonance imaging (MRI) systems, said magnet comprising:

a cryostat containing a super-conducting coil for generating lines of force, said coil surrounding a vertical core of magnetizable material, said core being external to said cryostat while said coil is internal to said cryostat, a pair of vertically spaced-apart magnetizable beams each having a longitudinal axis extending horizontally from the top and bottom of said vertical core, a pair of pole pieces, each having an axis perpendicular to the longitudinal axis of said beams, each pole piece being oppositely disposed at the ends of said beams, one pole piece above and one pole piece below the other to define equal sized airgaps at the ends of each of said beams, a part of one side of each of said airgaps facing said core and the other sides of each of said airgaps being open, making the patients readily accessible from three sides, and parts of the one side during imaging procedures, said oppositely disposed pole pieces being spaced apart in a vertical direction at a distance large enough to receive a patient into each of the airgaps for imaging purposes with the lines of flux perpendicular to the longitudinal axis of the patient, and extending through the patient perpendicular to an imaginary horizontal plane extending from one side of the patient to the other side of the patient, and said airgaps being of equal size whereby said super-conducting magnet is symmetrical about both vertical and horizontal central axes of the magnet.

2. The super-conducting magnet of claim 1 including means for shimming said pole pieces.

3. The super-conducting magnet of claim 2 wherein said means for shimming said pole pieces comprise shimming plates.

4. A super-conducting magnet for magnetic resonance imaging (MRI) systems, said magnet comprising:

a cryostat containing a super-conducting coil for generating lines of force, said coil surrounding a vertical core of magnetizable material, said vertical core being external to said cryostat, four pairs of vertically spaced apart magnetizable beams, each pair extending symmetrically from opposite ends of the vertical core in a longitudinal direction horizontally from the top and bottom of said core forming a plurality of back-to-back symmetrically spaced apart multiple C-shaped magnets having a common core, each of said four pairs of vertically spaced apart magnetizable beams being 90° removed from the closest pair of magnetic beams when following a circular path between the beams, a pole piece at each end of each of said beams, each of said pole pieces being vertically spaced apart and oppositely disposed to another pole piece to define four vertically extending airgaps having the same size for receiving patients to be imaged therein, said magnet being symmetrical about both vertical and horizontal central axes, said magnetic lines of force in the four airgaps being perpendicular to the longitudinal axis of the patients in the airgaps between said pole pieces and said magnetic lines of force extending through the patients perpendicular to an imaginary horizontal plane extending from one side of the patient to the other side of the patient, and a part of one side of each of the airgaps facing said core and the other sides of each of said airgaps being open, whereby the patients are readily accessible from three sides and parts of the one side during an imaging procedure.

* * * * *